United States Patent [19]
Adams et al.

[11] Patent Number: 5,563,833
[45] Date of Patent: Oct. 8, 1996

[54] USING ONE MEMORY TO SUPPLY ADDRESSES TO AN ASSOCIATED MEMORY DURING TESTING

[75] Inventors: Robert D. Adams, Essex Junction; John Connor, Burlington; James J. Covino; Roy C. Flaker, both of Essex Junction; Garrett S. Koch, Cambridge; Alan L. Roberts, Jericho; Jose R. Sousa; Luigi Ternullo, Jr., both of Colchester, all of Vt.

[73] Assignee: International Business Machines Corporation, Armonk, N.Y.

[21] Appl. No.: 398,465

[22] Filed: Mar. 3, 1995

[51] Int. Cl.⁶ ........................... G11C 7/00
[52] U.S. Cl. ........................... 365/201; 365/49
[58] Field of Search .............. 365/49, 201, 189.05; 371/21.1, 21.2

[56] References Cited

U.S. PATENT DOCUMENTS

| | | | |
|---|---|---|---|
| 5,099,481 | 3/1992 | Miller | 371/21.2 |
| 5,107,501 | 4/1992 | Zorian | 371/21.2 |
| 5,138,619 | 8/1992 | Fasang et al. | 371/21.2 |
| 5,224,101 | 6/1993 | Popyack, Jr. | 371/21.1 |
| 5,258,986 | 11/1993 | Zerbe | 371/21.2 |
| 5,311,520 | 5/1994 | Raghavachari | 371/21.2 |
| 5,329,471 | 7/1994 | Swoboda et al. | 371/16.2 |
| 5,377,148 | 12/1994 | Rajsuman | 365/201 |

*Primary Examiner*—A. Zarabian
*Attorney, Agent, or Firm*—Calfee, Halter & Griswold

[57] ABSTRACT

An associated memory structure having a plurality of memories amenable for testing and a method of testing the memories is provided. First and second memories are formed, wherein data in the first memory provides a basis for at least a portion of the input to the second memory during functional operation of two memories. Preferably, an output latch for receiving the output test data from the first memory is provided. Means are provided for loading the first memory with data which is utilized as a basis for providing at least a portion of the input to the second memory. An access path from the output port of the first memory to the input port of the second memory allows use of the data in the first memory to generate at least a portion of the input to the second memory. The first memory is first tested independently of the second memory. Thereafter, the first memory is loaded with preconditioned data that is used as a basis for inputs to the second memory during testing of the second memory. The second memory is then tested by generating inputs to the first memory during testing of the second memory. Thus, outputs of the first memory constitute at least a portion of test data inputted to the second memory. A latch is provided to capture the output of the test data from the second memory.

17 Claims, 7 Drawing Sheets

USING ONE MEMORY TO SUPPLY ADDRESSES TO AN ASSOCIATED MEMORY DURING TESTING

RELATED APPLICATION

U.S. patent application Ser. No. 08/398,468, filed Mar. 3, 1995, entitled "BIST Tester for Multiple Memories" (Atty. Docket No. BU9- 94- 146).

FIELD OF THE INVENTION

This invention relates generally to testing of memory devices, and in one aspect to a built-in self-test for VLSI circuits which are contained on semiconductor chips. In a more particular aspect, this invention relates to a built-in test for memories on semiconductor chips wherein there are a plurality of memories on the chip and wherein one memory is associated with another; i.e., one memory provides at least part of the information required by one or more additional memories known as associated memories during conventional operation. Such a memory relationship can be, for example, on microprocessors wherein there are conventional memories which store data such as data cache unit (DCU) memories and which have associated therewith CAM memories, i.e., content addressable memories, which supply part of the address to the DCU memories during conventional operation, although other types of associated memories can be tested according to this invention.

BACKGROUND ART

Testing of associated memories of the type described above, formed on semiconductor substrates, has often been done by the provision of a built-in self-test (BIST). BISTs include a state machine formed on the silicon substrate which contains the associative memories and the other VLSI circuit components such as the logic components of a microprocessor chip. Such a BIST is shown in co-pending application Ser. No. 08/398,468, filed Mar. 3, 1995, and entitled "BIST Tester for Multiple Memories" (Atty. Docket No. BU9-94-146); and a state machine for testing a DCU type memory is shown in U.S. Pat. No. 5,173,906.

In testing multiple memories, conventional prior art practice has been to surround each of the memories with latches and multiplexors and to test each memory independently, from data supplied by the state machine of the BIST or through a scan-chain from an off-chip tester. Also, conventional prior art has employed a separate BIST for each memory. While in many cases this works quite well, it does have certain drawbacks, especially in the case of testing associated memories. One such drawback is the requirement of a significant amount of chip area or "real estate" needed for forming the latches and multiplexors which bound the various memories. Another drawback is the totally independent testing of an associated memory (i.e., one that in normal operation receives a portion of its information or data, such as a portion of the address, from another memory) is that the path between the two memories is not tested. This is because the test signals to this dependent memory are separately supplied from the BIST rather than being supplied through the source memory. Thus, totally independent testing does not test the performance of the associated memories using the critical path between one memory and the other. Any problems or improper functioning of the critical data path between the two memories in the transfer of data is not detected by this type of testing since each memory is tested separately and independently from data generated from the BIST machine which does not use one memory to supply data to another memory, i.e., with the signal timings and along the path which the data flows during functional operation. While the problem of testing associated memory is extant in BIST tests, it also exists in other types of tests of memories, e.g., signals from off-chip testers applied to test memory circuits and other dependent circuits.

SUMMARY OF THE INVENTION

According to the present invention, an associated memory structure comprised of a plurality of memories amenable for testing and a method of testing the memories is provided. First and second memories are formed (on a semiconductor substrate in the preferred embodiment) wherein the data in the first memory provides a basis for at least a portion of the input to the second memory during functional operation of the two memories. Means for inputting test signals into the first memory is provided, and preferably an output latch for receiving the output test data from the first memory is provided. Means are provided for loading the first memory with data which is utilized as a basis for providing at least a portion of the input to the second memory. An access path from the output port of the first memory to the input port of the second memory is provided to thereby allow use of the data in the first memory to generate at least a portion of the input of the second memory. The first memory is first tested independently of the second memory. Thereafter, the first memory is loaded with preconditioned algorithmic data that is used as a basis for inputs to the second memory during testing of the second memory. The second memory is then tested by generating inputs to the first memory during the test of the second memory, which will cause outputs of the first memory to be supplied to the second memory which constitutes at least a portion of test data inputted to the second memory. A latch is provided to capture the output of the test data from the second memory.

DESCRIPTION OF THE PREFERRED EMBODIMENT(S)

The embodiment described here utilizes a content addressable memory (CAM) and a random access memory (RAM) where the RAM obtains part of its addressing from the CAM. According to prior art techniques, each would need input and output latches and would be tested independently. As described herein, a method and structure has been provided to test the two memories while maintaining their interdependent nature during test just as in functional operation. This method provides a reduction in area consumption by test-only circuitry and also enhances the test quality by eliminating timing differences between test operation and functional operation.

Figure 1:
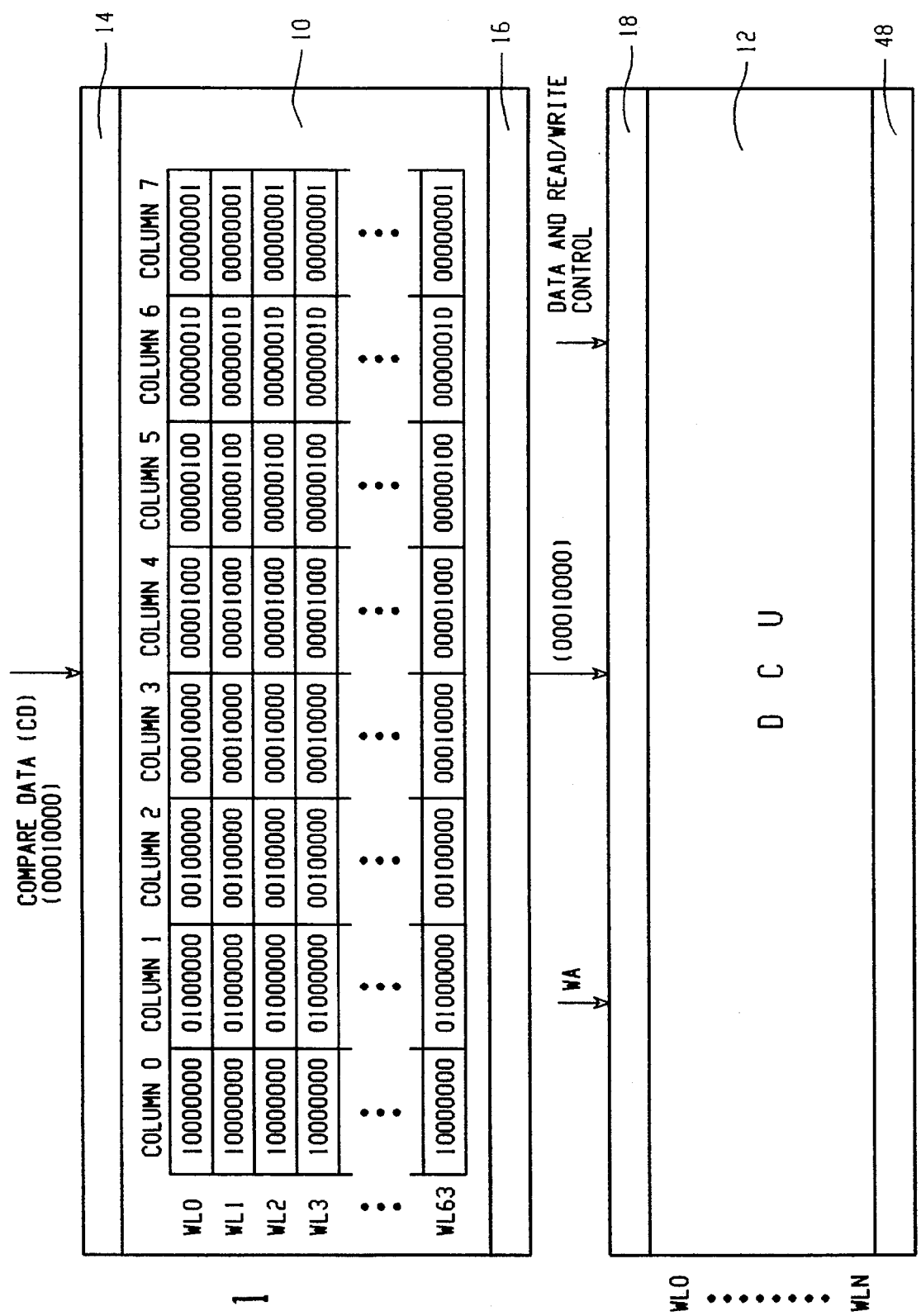
FIG. 1 is a diagrammatic view of the functioning of a content addressable memory (CAM) and its function to provide input to a data cache unit (DCU) memory in one embodiment of this invention.

Referring now to FIG. 1, a representation of a typical content addressable memory (CAM) 10 and its functioning to provide a partial input to a data cache unit (DCU) memory 12 is shown. In this representation, eight column locations (Column 0–Column 7) are provided, and 64 rows of wordlines (WL0–WL63) are provided. Eight bits of binary data ("1"s, "0"s) are stored in each row/column location and form the basis of the data to which inputs are compared. Each row/column location has at least one additional data valid bit (not shown) that must be set true for the output compare to be functional.

The test inputs are from a built-in self-test (BIST) state machine such as that described in related application Ser. No. 08/398,468, filed Mar. 3, 1995, and entitled "BIST Tester for Multiple Memories" (Atty. Docket No. BU9-94-146) or from BISTs as described in U.S. Pat. No. 5,173,906 which is incorporated herein by reference.

In operation, the CAM 10 receives the necessary compare data CD as input to input port 14 of the CAM 10 wherein the compare data CD is compared to determine if that particular bit pattern is stored at a given word line. (In this embodiment, eight bit patterns are compared, but other patterns can be used.) This is shown diagrammatically in FIG. 1 wherein a series of bit patterns are stored in the CAM 10. In the illustrated embodiment, each wordline (row) contains eight 8-bit patterns. Each pattern is stored at a different column location (Column 0–Column 7) on the wordline. The CAM 10 works on the principle that eight data bits are stored in each column/row location, and that the input is supplied to input port 14 as compare data bits CD. If a match occurs at a column location on the selected wordline, then the column comparator asserts a "1". If all columns happen to match the compare data CD, then all eight column comparators would assert "1"s and the CAM 10 output at output port 16 would be "11111111". If a mismatch is found in a column on the selected wordline, then the column comparator output is forced to a "0". The eight comparator outputs from output port 16 of CAM 10 are supplied as one part of the input to DCU 12 at input port 18 thereof. In the illustration as shown, if compare data bits 00010000 were supplied to input port 14, there would be a comparison in column 3 of the selected wordline causing the column 3 comparator to assert a "1" and the remaining seven column comparators to output "0"s which would result in the CAM 10 outputting via output port 16 the 8-bit address 00010000 to input port 18 of the DCU 12. The CAM output matches the 8-bit pattern in column 3 because the column locations were purposely written with the patterns shown in FIG. 1 and not because the CAM actually outputs the pattern store in column 3. This operation is well known in the art and need not be further described.

The input port 18 of the DCU 12 receives the output from the CAM 10 as a one of eight bit address. A word address, defined as WA, data, and Read/Write (R/W) control supplied by the BIST state machine is also received at port 18. The path from the CAM 10 to the DCU will be described presently. In any event, the output of the CAM is a function of the data stored therein and the compare data CD.

Figure 2:
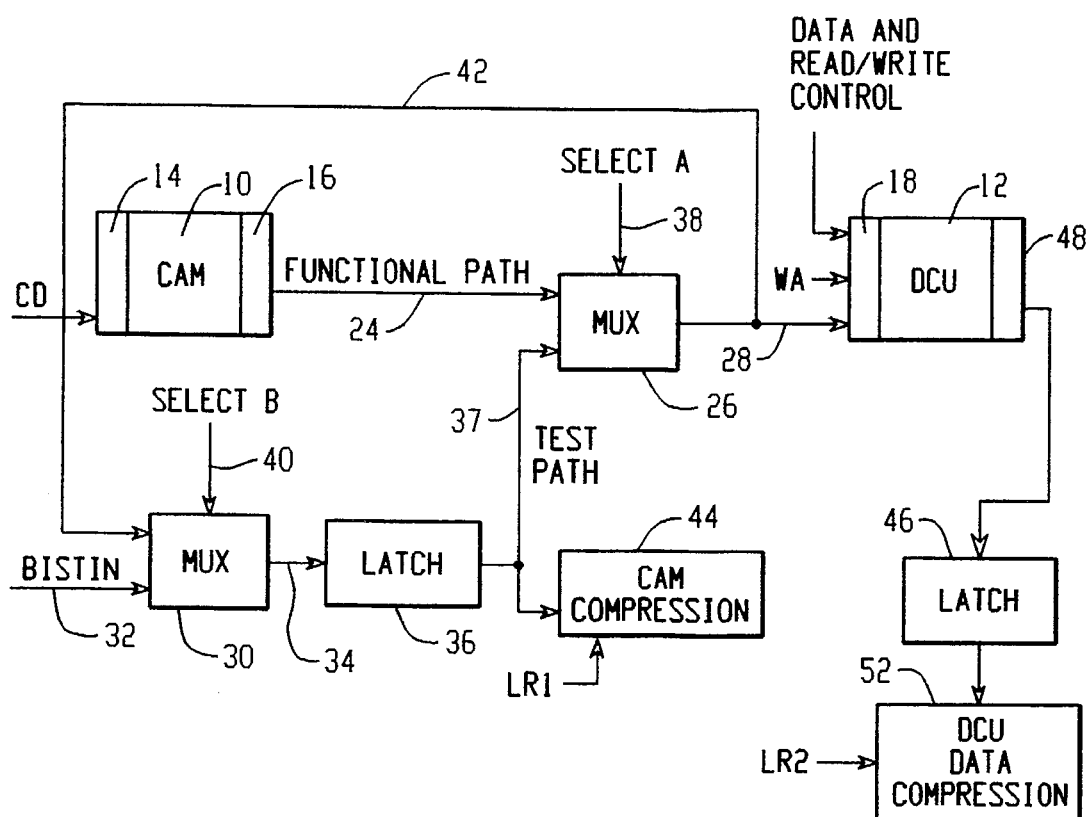
FIG. 2 is a block diagram showing a typical prior art construction of a typical configuration for testing the functioning of a CAM memory associated with a DCU memory.

Referring now to FIG. 2, a typical prior art configuration or construction or interconnect of a CAM 10 and DCU 12 with the necessary latches and multiplexors used to both verify the integrity of and control the selection between the operational path and the test paths to and from memories 10 and 12 is shown. It is to be understood that this figure is representative of only one particular configuration involving two specific types of associated memories, which is but one of several possible connections of multiplexors and latches for functional operation and testing. Nevertheless, FIG. 2 represents a typical implementation of both operational and test paths for these types of associated memories.

As indicated above, in this embodiment, the CAM 10 is provided which in normal operation (i.e., not test mode) provides a part of the bit address to the DCU 12. The remainder of the bit address, as well as the wordline address for the DCU 12 is provided from a separate source, i.e., a source different from the CAM. Data and R/W control are also provided from a source separate from the CAM. Thus, in operation, when the memories are being utilized and there needs to be an access to the DCU memory 12, a portion of the address for such access is supplied by the CAM 10. Such type of associated memory operations is well known in the art.

Also as is well known in the art, it is necessary to test both the CAM and the DCU memories before chip functional operation. To this end, in the past, both the CAM 10 and the DCU 12 have been tested independently through all phases of BIST testing, even though there is an associative relationship between the DCU 12 and the CAM 10 during functional operation. The testing and operation of the memories 10 and 12 is typically carried out using a prior art structure similar to that in FIG. 2.

The operational path between memories 10 and 12 is comprised of CAM output 24 being supplied as input to multiplexor group 26 (which in structure is defined by eight multiplexors), and the output 28 of multiplexor group 26 provided as input to input port 18 on the DCU 12 as an 8-bit predecoded address. The test path into the DCU 12 is comprised of an 8-bit predecoded address provided as input 32 to multiplexor group 30 (which in structure is defined by eight multiplexors); the output 34 of multiplexor group 30 is supplied to latch group 36 (which in structure is defined by eight latches); the output 37 of latch group 36 is supplied as the other input to multiplexor 26; and the output 28 of multiplexor group 26 is provided to DCU's inputs port 18. A second test path for verifying CAM outputs is comprised of output 24 being supplied as input to multiplexor group 26, output 28 of multiplexor group 26 being routed along feedback path 42 to the other input of multiplexor group 30, output 34 of multiplexor group 30 being supplied to latch group 36, and output 37 of latch group 36 being supplied to CAM data compression 44. CAM data compression 44 can be actuated by load result signal LR1 from the BIST. Similarly, latch 46 receives an output from output port 48 of the DCU 12, and provides DCU data compression 52 with an output. DCU data compression can be actuated by load result signal LR2.

Still referring to FIG. 2, when the CAM 10 is operating in a functional manner, i.e., supplying functional data, the output from the CAM 10 is supplied to the multiplexor 26, and the select signal 38 selects this input 24 as that passed to output 28 of multiplexor 26 which is delivered to the input port 18 of the DCU memory 12 to supply the eight pre-decoded address bits.

However, as indicated before, the CAM 10 and the DCU memory 12 must be tested before they are put into operation or made functional. To this end, both the CAM and the DCU memories are tested separately. To test the CAM 10, the necessary test patterns are supplied as inputs to the CAM and to compare with data in memory, and the compare results are outputted from output port 16 to the functional data line 24 to the multiplexor 26. Conventional test patterns can be applied as is well known in the art. In this case, the signal select 38 is used to select the CAM out 24 to provide the output 28 from the multiplexor 26 which then feeds back signal 42 to provide the output from multiplexor 30 to the latch 36 which constitutes the test data being captured from the CAM 10. The output 37 from latch group 36 (which in structure is defined by eight latches) is delivered to the data compression 44, and the load result signal is actuated during the testing of the CAM to load the test results. Thus, the CAM 10 is tested independently of the DCU.

Turning now to the testing of the DCU memory 12 and still referring to FIG. 2, when the memory 12 is to be tested, the select signal 40 selects the BIST input signal 32 to be outputted as the output 34 from the multiplexor 30 to the latch 36. The latch 36 supplies as output 37 a signal to the multiplexor 26 where the select signal 38 selects the input 37 to the multiplexor 26 as the output 28 to the input port 18 of the memory 12. Thus, for testing the DCU memory 12, the 8-bit pre-decoded address which is provided to the input port 18 of the DCU 12 is not provided from the CAM 10 (from which it is provided during functional operation), but rather is provided from the BIST test machine and controlled by the signal patterns thereof. There are two undesirable results of this construction. First, a significant amount of area is required because of the utilization of two multiplexors and a latch. Moreover, and more significantly, the timings of signals on the functional path through the CAM memory 10 to the input port 18 of the DCU 12 for the eight bits of the address is not being tested, and the timing of these functional signals may vary from the timing of the test signals generated by the BIST machine. Thus, while the DCU 12 may perform well with all of the signals from the BIST machine in the test mode, in actual operation the DCU memory 12 may not properly function when it receives addresses at input port 18 from the CAM memory 10 based on the timing of the CAM memory 10 and the timing of the functional path.

Figure 3:
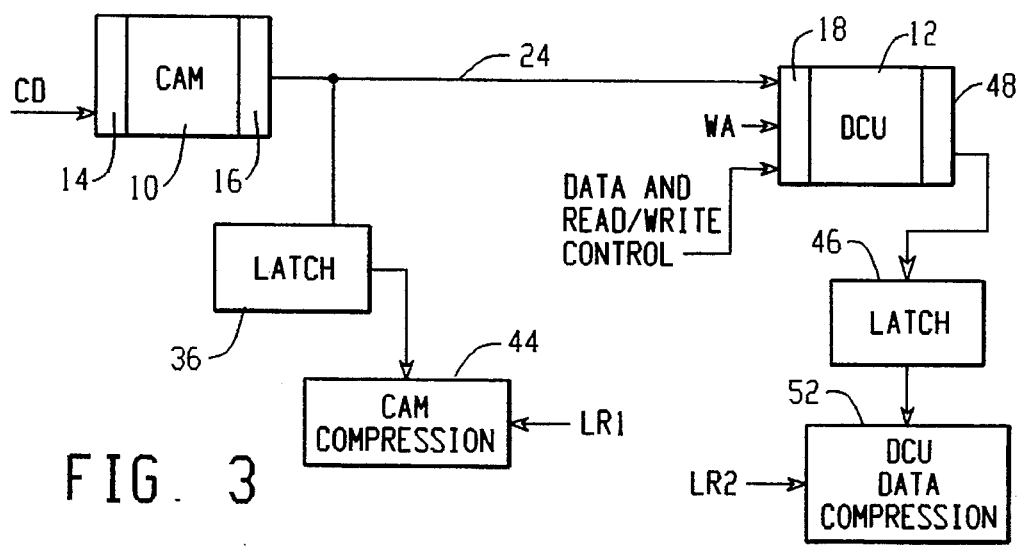
FIG. 3 is a block diagram showing the construction according to this invention of the interconnection for testing the functioning of a CAM memory and a DCU memory receiving some input data therefrom.

Turning now to FIG. 3, construction of the interconnection between the CAM memory 10 and the DCU memory 12 according to the present invention is shown. According to this invention, the functional output 24 from the output port 16 of the CAM 10 is asserted directly on the input port 18 of the DCU 12 without the interposition of any multiplexors or latches in the path and is used both in the functional mode and the test mode of the DCU 12. A latch 36 is provided to receive the output from the output port 16 of the CAM memory 10 which is the same type of latch as shown in FIG. 2, and a data compression 44 also is provided which is the same as shown in FIG. 2. A latch 46 is connected to the output port 48 of the DCU memory 12 which in turn is provided with a data compression store 52 that is actuated by load result signal LR2.

In conventional operation of the embodiment as shown in FIG. 3, the output from the output port 16 of the CAM memory 10 is supplied directly to the input port 18 of the DCU memory 12 as eight pre-decoded address signals in the same way that the input signal is provided in the prior art from the multiplexor 26, although in this case it is supplied directly to the input port 18. During the normal operation and supplying of the data as the functional data on line 24 to the input pork 18, data is being supplied to the latch 36, but signal LR1 to the data compression 44 is not actuated so that the outputted data is not captured with load result.

The testing of the CAM and the DCU memories in the embodiment as shown in FIG. 3 is as follows. For testing purposes, the CAM memory is first tested by supplying the necessary input patterns thereto as described with respect to FIG. 2 from a BIST. The output of the compare pattern is loaded into the latch 36 and the load result signal LR1 is actuated to enable the data compression 44 to test the CAM in the same way the CAM memory 10 has been tested in the prior art.

Once the CAM memory 10 has been tested, the DCU memory 12 can then be tested. The CAM memory 10 is loaded with the preconditioned decode addresses by BIST for the particular tests being performed on the DCU memory from the BIST. Then, the DCU memory 12 is tested, supplying the word address portion of addresses through the port 18 just as in FIG. 2. However, compare data CD is provided to the CAM input port 14 by the BIST which corresponds to the three-bit portion of address being tested in the DCU 12 and the output from the CAM 10 provides the 1 out of 8 select address as input to the DCU 12 during the test. The output from the DCU memory 12 is outputted from port 48 into latch 46, and the load result signal LR2 is actuated to capture the output and determine pass/fail result of the test in the data compression store 52. Thus, the testing of the DCU 12 is done utilizing input from the CAM memory 10 using its particular signal timings on the path 24 which will be the same as utilized during actual operation of the memory devices rather than a separate timing path from the testing machine as in the prior art.

The following FIGS. 4–7 describe parallel processing of the CAM and the RAM in a DCU. CAM designs have been classically used in the word dimension as fully associative elements. An address field is compared against a column of CAM cells organized N cells wide and R rows deep. If a match occurs, a wordline associated with the matched row is selected. The selected wordline drives across standard memory cells which contain the desired data. This prior art process creates a situation where the RAM is waiting for the CAM to process its row selection address. In current processor architectures, a key design goal is to design processors that operate at ever faster processing speeds. This design goal holds true for both testing and general operation of the microprocessor architecture.

Figure 4:
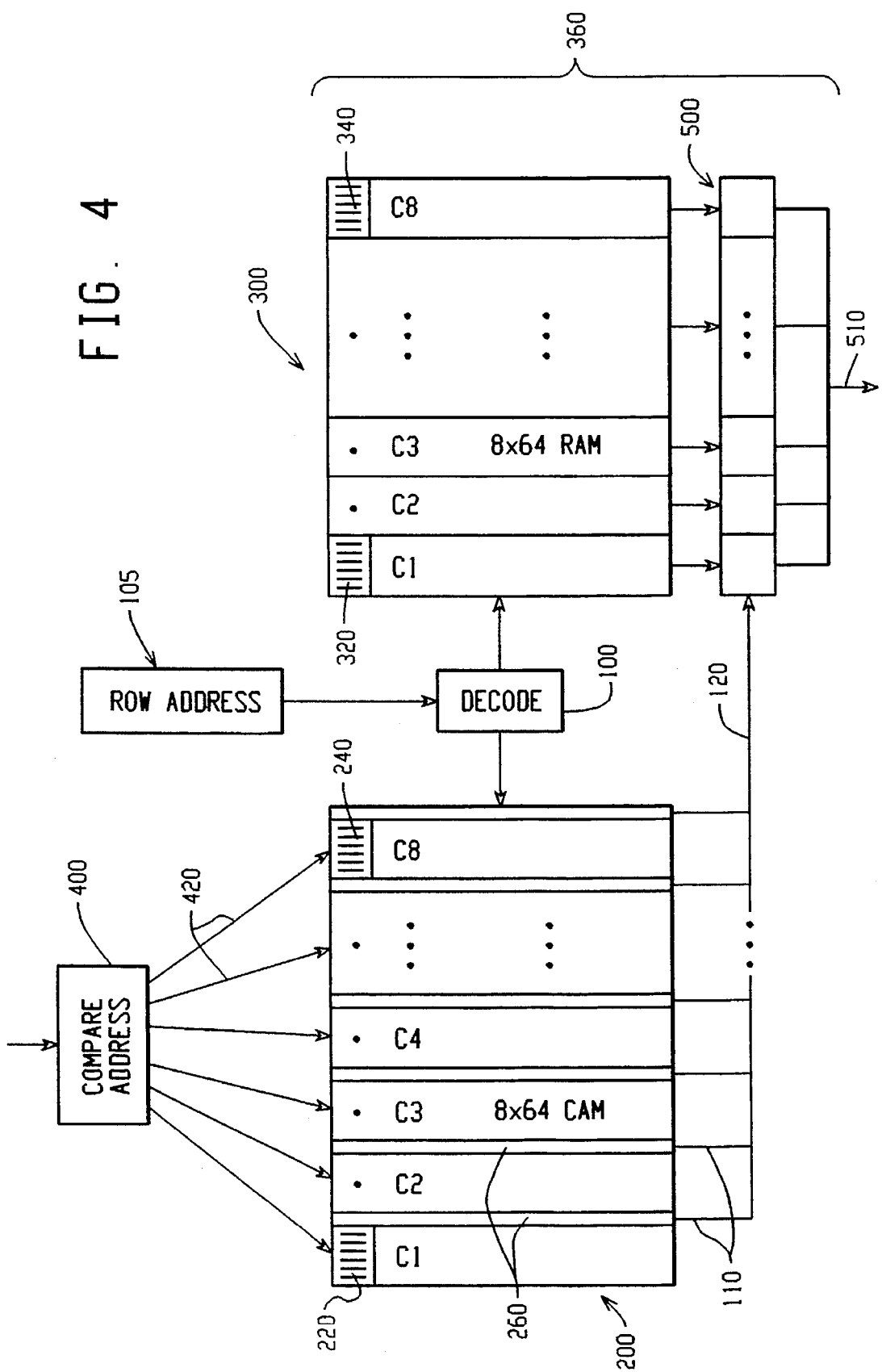
FIG. 4 is a block diagram of the invention showing specific architecture that provides for parallel processing of the CAM and RAM.

In reference to FIG. 4, there is a block diagram showing an architecture that provides parallel processing of the CAM and RAM which does not require the RAM to wait for the CAM to process the row address for the RAM. In addition, there is a CAM design that performs associative or semi-associative decode bit addressing of a RAM. It is noted that RAM 300 and MUX 500 can be operated as a TAG, a data storage array architecture, or a DCU, generally indicated by element number 360. In operation, decoder 100 will select which one of 64 rows in the CAM 200 and RAM 300 will be selected when the decoder receives a row address signal 105. Concerning the operation of the RAM 300, the selected RAM row will download all data stored in the selected data locations onto the associated eight RAM columns, referred to as C1–C8. For example, data locations 320 through 340 would be downloaded to C1 through C8, respectively. The RAM data will thereby be routed to MUX 500, illustrated as an 8×1 MUX, where one of the eight inputs from the RAM will be enabled to immediately route one of the columns of RAM data to output line 510. Concerning the operation of the CAM 200, a row address 105 signal arrives at the decode 100, a compare address 400 is simultaneously routed, via lines 420, to every CAM location (i.e., locations 220 to 240) on every CAM row. If there is a match on the selected row, then a cascaded OR 260 (one per column C1 to C8) will pull the associated CAM column output line 110 high. The output lines 110, which form a bus 120, are each coupled to MUX 500. In operation, for example, CAM column C1 can output a signal to output line 110 that will program MUX 500 to allow data in RAM column C1 to be output to output line 510. In summary, by using a row decode circuit 100 to simultaneously select the row of the RAM and CAM, and by using bit addressing of the CAM, the MUX 500 can be enabled before the data in the selected row of the RAM arrives. Therefore, the RAM processing will not have to wait for the CAM processing to first be completed.

Figure 5:
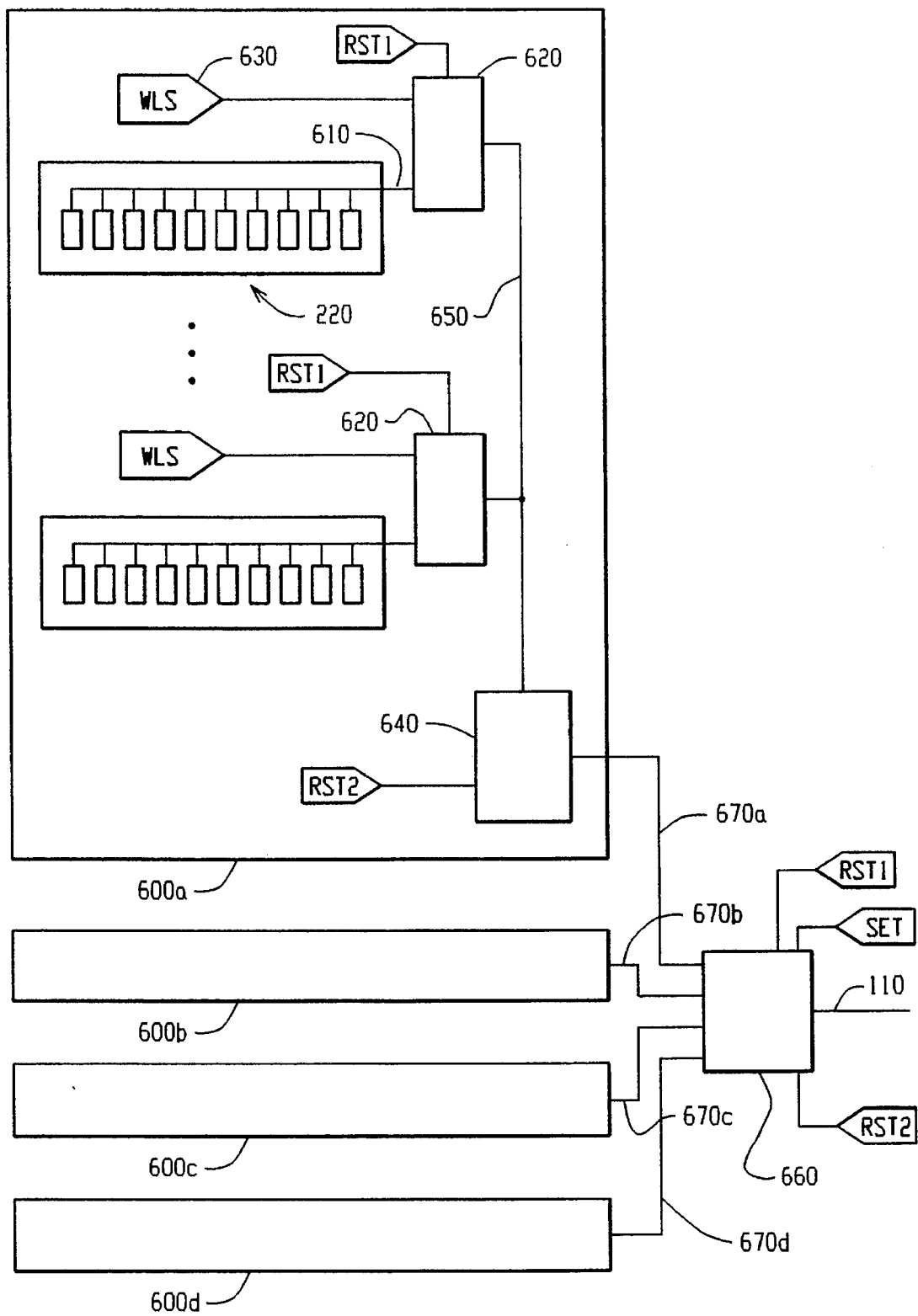
FIG. 5 is a block diagram of the invention showing the circuitry of a single CAM column and associated cascaded.

In reference to FIG. 5, there is shown a block diagram of the specific circuitry for a single CAM column and associated cascaded OR. The column of CAM locations and associated OR is divided into four equal blocks 600a–600d each having equal numbers of rows or address locations, i.e., location 220. In this example for illustration purposes, there are ten bit cells in each CAM locations. When the location receives the compare address, the results will either cause match line 610 to be a high or low voltage level. For example, when the compare address 400 matches the location 220, the cascaded OR coupled to the first CAM column C1 will be activated to output a high signal on the matching column output line 110. More particularly, the sequence of events are as follows: match line 610 outputs a high voltage, wordline select (WLS) 630 strobes, first cascaded OR circuit 620 will pull line 650 low, the second cascaded OR circuit 640 outputs a high voltage on line 670a, and the third cascaded OR circuit 660 will output a high voltage signal on the associated output line 110. It should be noted that WLS 630 is the input from the decode circuit 100. It should be further noted that the decode circuitry 100 includes the wordline driving circuitry (not shown).

Figure 6:
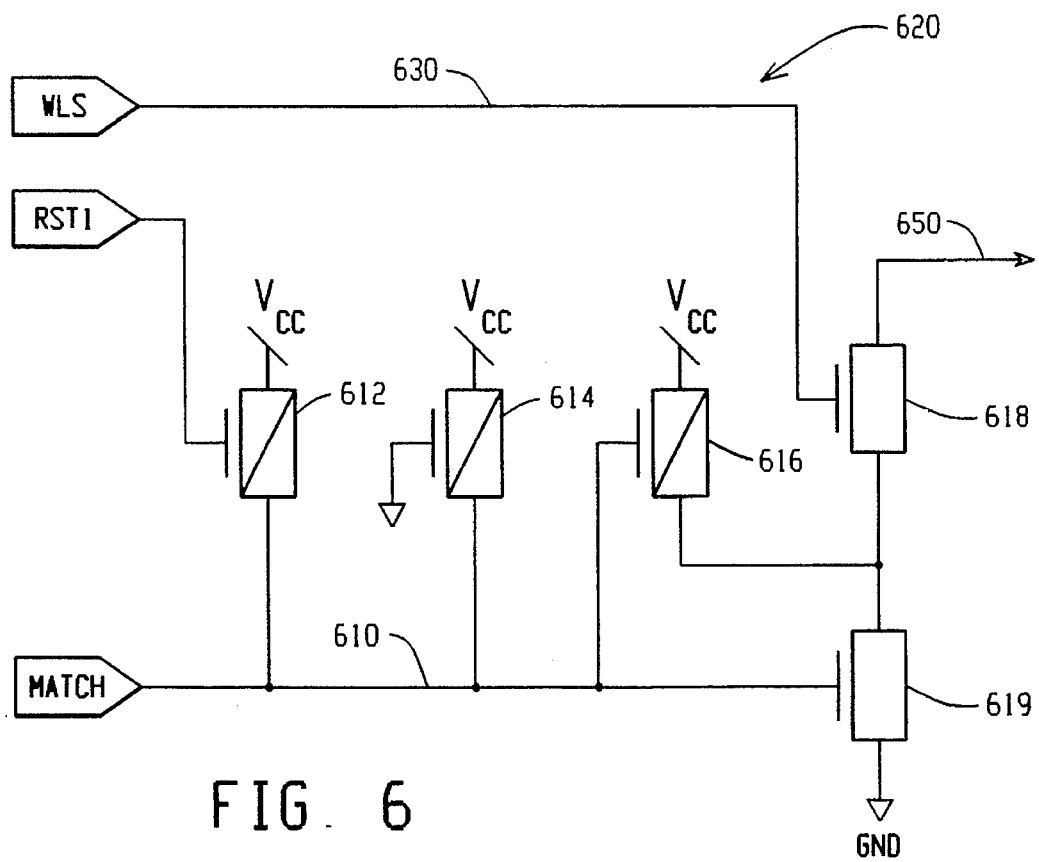
FIG. 6 is a circuit diagram of the invention showing a specific first cascaded OR circuit that is associated with every CAM address location.

In reference to FIG. 6, there is a circuit diagram of the first cascaded OR circuit 620 that is coupled to every CAM address location. In operation, if a match occurs between the compare address and the CAM location, match line 610 will remain high, via PFET 614, and NFET 619 will remain activated. Output line 650 will then be brought low after WLS 630 strobes. If there is no match, the following sequence occurs: match line 610 is brought low, NFET 619 will be turned off, so that when WLS strobes, NFET 618 will be activated, and output line 650 is maintained high. Whether there is a match or not, circuit 620 needs to be reset to the starting conditions. The starting conditions are reset after WLS strobes, by strobing rest RST1, causing PFET 612 to pull line 610 high with the assistance of PFET 614 so that output line 650 will be maintained high. It is pointed out that PFET 616 operates to reduce noise and prevent NFET 619 from turning on when there is no match. It is also noted that when WLS 630 strobes, it strobes across the entire eight columns in the CAM.

Figure 7:
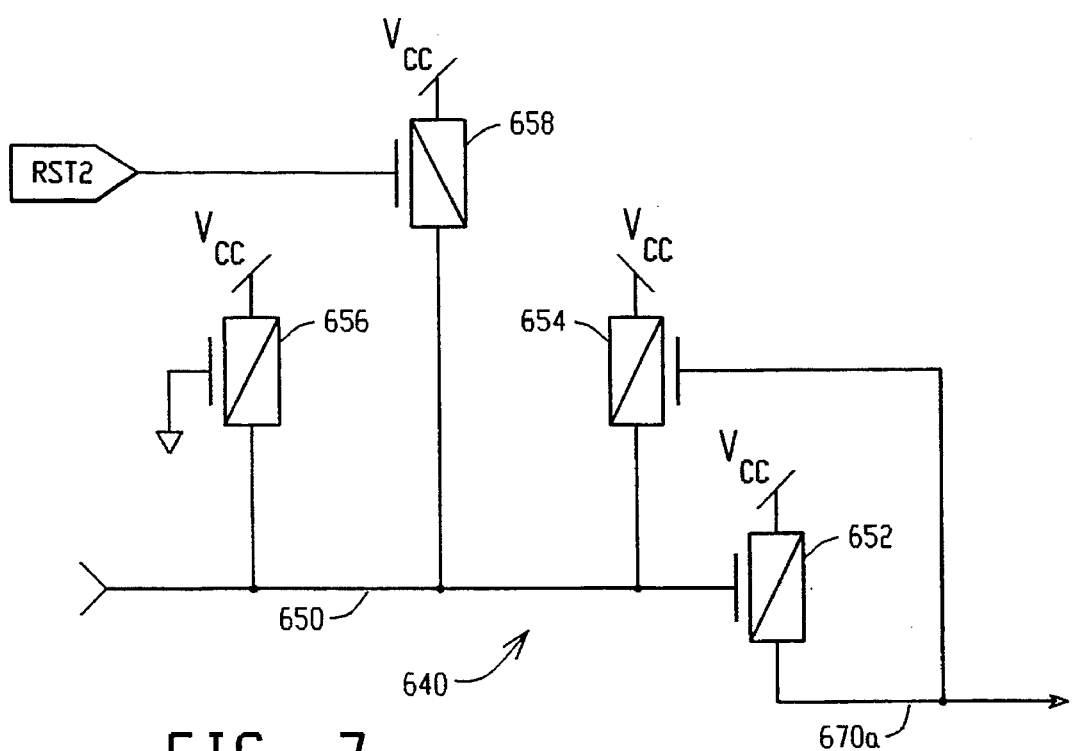
FIG. 7 is a circuit diagram of the invention showing a specific second circuit in the cascaded OR that receives output signals from the first cascaded OR circuit shown in FIG. 6.

Referring now to FIG. 7, there is a specific circuit diagram of a second circuit 640 in the cascaded OR. In operation, when output line 650 remains high, via PFET 656, PFET 652 remains deactivated; preventing output line 670a from being pulled high. When output line 650 is pulled low by activating NFETs 618 and 619, PFETs 656 and 654 are overpowered, and output line 670a is driven high turning off PFET 654. To rest circuit 650 to the initial conditions, reset signal RST2 strobes causing PFET 658 to pull output line 650 high with the assistance of PFET 656. It is noted that PFET 654 is used to reduce noise effects and prevents PFET 652 from accidentally turning on by assisting in pulling line 650 high.

Figure 8A:
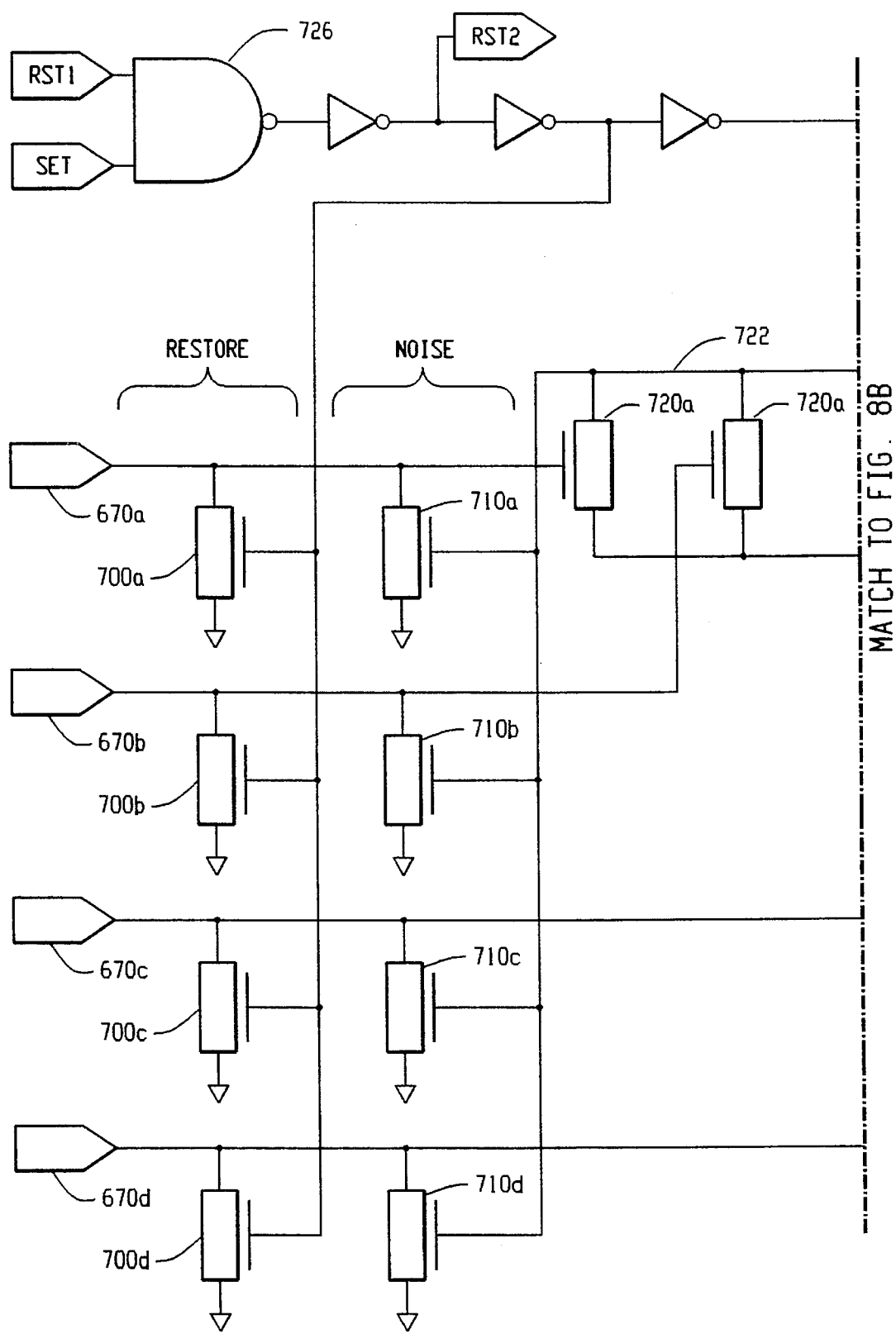
FIGS. 8a and 8b illustrate a circuit diagram of the invention showing a third circuit in the cascaded OR that receives output signals from the second circuit of the cascaded OR shown in FIG. 7.
Figure 8B:
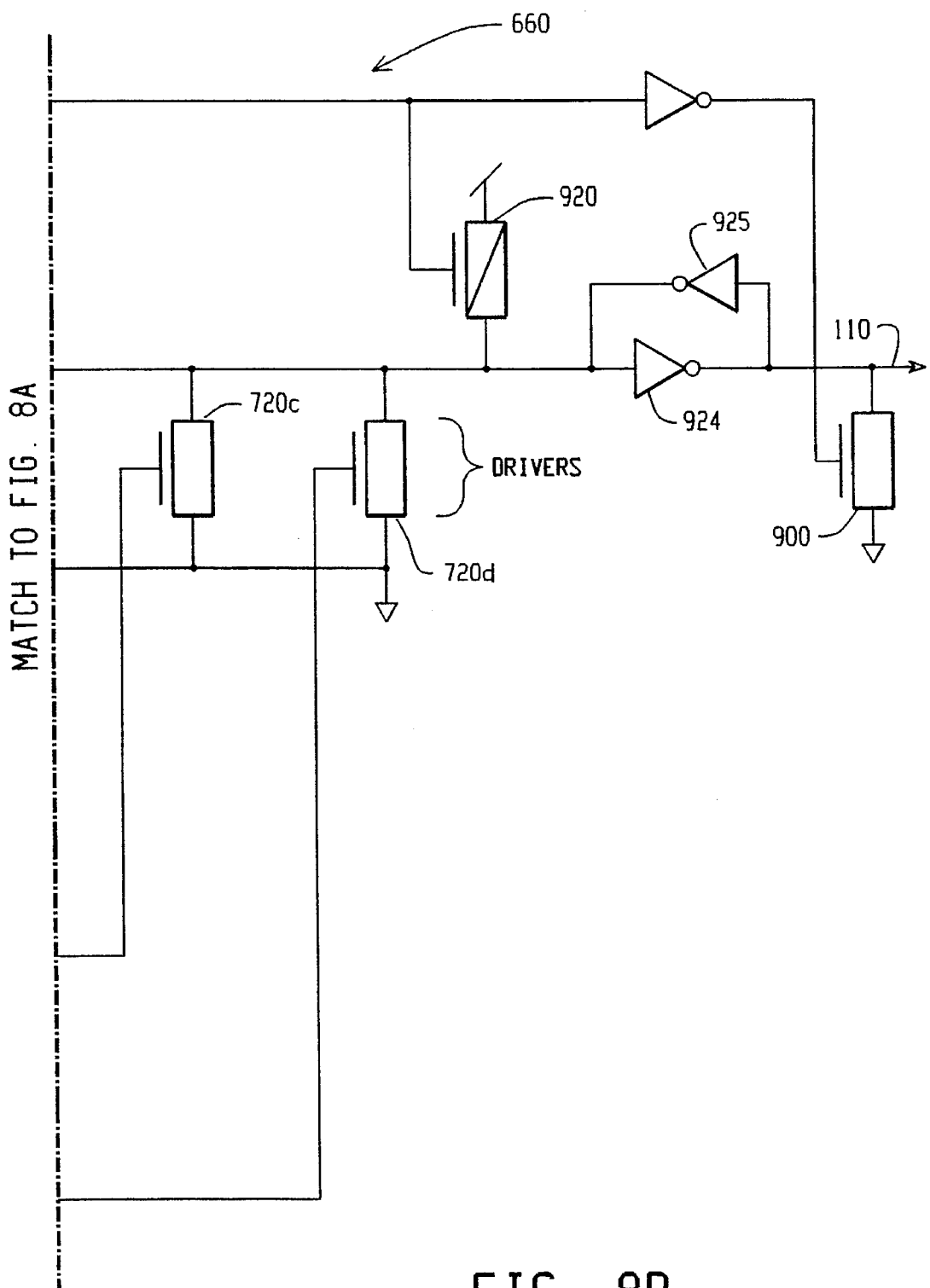

Referring now to FIGS. 8a and 8b, there is a circuit diagram of a third circuit 660 in the cascaded OR. In operation, when any of the output lines 670a–670d are brought high, a related NFET 720a–720d will drive node 722 low, which will drive output line 110 high via inverter 924. In contrast, when output lines 670a–670d all remain low, node 722 remains high, thus leaving output 110 low. It is noted that PFETs 710a–710d are used to reduce noise effects and prevent accidental turning on of the driving NFETs 720a–720d. To reset circuit 660, NAND gate 726 is activated by only strobing reset RST1, because SET is always maintained high after the initial start up of the integrated circuit. As a result, RST2 is driven low, and NFETs 700a–700d are activated to restore all output lines 670a–670d to a low voltage level. Additionally, PFET 920 will pull node 722 high, thus driving output line 110 low with the assistance of NFET 900 and inverter 924. It is noted that the SET signal is pulsed when the ship is powered up to initiate the cascaded OR for operation.

It is noted that there are many variations that one skilled in the art may employ in practicing the bit decoding of the RAM. In particular, the CAM columns may be divided into any number of parts and not just the four as illustrated. The re-partitioning of the CAM would then require a reconfiguration of the cascaded OR circuitry to provide for more levels or stages. Similarly, one skilled in the art would easily conceive of other logic devices other than the cascaded OR as illustrated.

Accordingly, the preferred embodiment of the invention will provide for parallel processing of the CAM and the RAM. Since the CAM processing is faster, the RAM data is immediately output upon reaching the MUX circuitry. With the foregoing description in mind, however, it is understood that this description is made only by way of example. Additionally, the invention is not limited to the particular embodiments described herein. Moreover, it is noted that there are various rearrangements, modifications, and substitutions that may be implemented without departing from the true spirit of the invention as hereinafter claimed.

Thus, it can be seen that according to the present invention where there are associative memories, i.e., one memory dependent upon another for its input during normal operation, testing of the associative memory is performed during the test function by actually providing signals for test purposes from the memory associated therewith from which it will receive signals as during functional operation to thereby provide a more accurate and reliable test of the two memories and utilizing less chip area.

The particular invention as has been described in the preferred embodiment as it is utilized to test a CAM memory and an associated DCU memory. However, it is to be understood that the invention has equal applicability to the testing of many types of memory configurations wherein one memory is associated with another. One example of this is in certain TAG memories, i.e., memories which provide a tag of data which are added to data in another memory. These memory configurations can be tested in this manner. Moreover, the invention is not limited to BISTs, but is also applicable to other types of memory testing where one memory is dependent upon another during functional operation; e.g., memories where signals are received from off the chip for memory.

Accordingly, the preferred embodiment of the operation of a CAM decoder to supply addresses to associated memories during BIST testing has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed:

1. A method of testing first and second memories wherein each of said memories include input ports and output ports, and wherein said first memory includes stored data that provides the basis for at least a portion of the input data to the second memory, and wherein a data path is provided between the output port of said first memory and the input port of said second memory, said method comprising the steps of, testing said first memory with a test pattern, thereafter, loading said first memory with said stored data to provide a basis for the output of testing data from said first memory, and testing said second memory using the output of said testing data From said first memory as at least a portion of the test data input to said second memory and outputting test results from said second memory.

2. The method of claim 1 wherein said testing data from said first memory is delivered to said second memory on said data path.

3. The method as defined in claim 2 further characterized by utilizing a second source of input of testing data as input to said second memory together with the output testing data from said first memory.

4. The method as defined in claim 2 wherein said first memory is a content addressable memory, and compare data is inputted into said first memory to generate said output testing data therefrom.

5. The method as defined in claim 2 wherein the testing of said first memory includes latching the test results therefrom as load results.

6. The method as defined in claim 3 wherein said memories are on a semiconductor chip, and said testing of both first and second memories is performed by a built-in self-test.

7. The method as defined in claim 6 wherein said second input to said second memory is from said built-in self-test.

8. The method as defined in claim 7 wherein said first memory is a content addressable memory, and the data output of said second memory is directly readable.

9. The method of claim 8 including the steps of latching the test results of the test of said first memory following the test thereof, and thereafter latching the test results of said second memory after testing thereof.

10. A circuit, comprising
   a) a first and a second memory;
   b) means for inputting test signals to the first memory;
   c) means for loading the first memory with stored data to provide a basis for testing data;
   d) means for outputting testing data from the first memory with said stored data stored therein; and
   e) means for testing the second memory and outputting data from said second memory based at least in part on the testing data outputted from the first memory and inputted to said second memory.

11. The device of claim 10 wherein there is a data path between said first and second memories, and said testing data from said first memory to said second memory are asserted on said path.

12. The device of claim 11 wherein input to said second memory includes input from a source other than the testing data of said first memory.

13. The device of claim 11 wherein said first memory is a content addressable memory and the data of said second memory is directly readable.

14. The device of claim 10 further including a latch to latch the outputted testing data of the first memory.

15. The device of claim 10 further including a latch to latch the output data of said second memory.

16. The device of claim 11 wherein said memories are formed on a semiconductor chip.

17. The device of claim 16 further including a built-in self-test to test both memories.

* * * * *